United States Patent
Lin

(10) Patent No.: US 10,381,512 B2
(45) Date of Patent: *Aug. 13, 2019

(54) LIGHT-EMITTING DEVICE

(71) Applicant: EPISTAR CORPORATION, Hsinchu (TW)

(72) Inventor: Yi-Chieh Lin, Hsinchu (TW)

(73) Assignee: Epistar Corporation, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/836,134

(22) Filed: Dec. 8, 2017

(65) Prior Publication Data

US 2018/0102458 A1 Apr. 12, 2018

Related U.S. Application Data

(63) Continuation of application No. 14/638,593, filed on Mar. 4, 2015, now Pat. No. 9,859,460.

(30) Foreign Application Priority Data

Mar. 6, 2014 (TW) .............................. 103107811 A

(51) Int. Cl.
| | |
|---|---|
| *H01L 33/06* | (2010.01) |
| *H01L 33/58* | (2010.01) |
| *H01L 33/30* | (2010.01) |
| *H01L 33/00* | (2010.01) |
| *H01L 33/12* | (2010.01) |
| *H01L 33/02* | (2010.01) |
| *H01L 33/38* | (2010.01) |

(52) U.S. Cl.
CPC ............ *H01L 33/06* (2013.01); *H01L 33/002* (2013.01); *H01L 33/02* (2013.01); *H01L 33/12* (2013.01); *H01L 33/30* (2013.01); *H01L 33/58* (2013.01); *H01L 33/38* (2013.01)

(58) Field of Classification Search
CPC ....... H01L 33/06; H01L 33/002; H01L 33/12; H01L 33/38; H01L 33/58; H01L 33/30; H01L 33/02
USPC ...................................................... 257/13, 94
See application file for complete search history.

(56) References Cited

U.S. PATENT DOCUMENTS

| | | | |
|---|---|---|---|
| 4,575,742 A * | 3/1986 | Kohashi | ............ H01L 33/0025 117/57 |
| 5,537,433 A | 7/1996 | Watanabe | |
| 5,614,734 A | 3/1997 | Guido | |
| 5,779,924 A * | 7/1998 | Krames | ................... H01L 33/20 216/24 |
| 6,057,562 A | 5/2000 | Lee et al. | |
| 2004/0119081 A1 | 6/2004 | Takemi | |
| 2004/0135166 A1 | 7/2004 | Yamada et al. | |
| 2005/0087753 A1* | 4/2005 | D'Evelyn | ................. C30B 9/00 257/98 |
| 2007/0045651 A1 | 3/2007 | Suzuki | |

(Continued)

FOREIGN PATENT DOCUMENTS

TW 200501444 A 1/2005

*Primary Examiner* — Tong-Ho Kim
(74) *Attorney, Agent, or Firm* — Muncy, Geissler, Olds & Lowe, P.C.

(57) ABSTRACT

The present disclosure provides a light-emitting device. The light-emitting device includes a substrate, a light-emitting stack on the substrate, and a semiconductor window layer comprising AlGaInP series material disposed between the substrate and the light-emitting stack.

20 Claims, 4 Drawing Sheets

(56) References Cited

U.S. PATENT DOCUMENTS

| | | |
|---|---|---|
| 2007/0280322 A1 | 12/2007 | Sato et al. |
| 2008/0315176 A1 | 12/2008 | Takeuchi et al. |
| 2009/0135872 A1 | 5/2009 | Uchida et al. |
| 2010/0133507 A1* | 6/2010 | Takao ............... H01L 33/30 257/13 |
| 2011/0186814 A1 | 8/2011 | Kim |
| 2012/0155899 A1 | 6/2012 | Watanabe |
| 2012/0168816 A1* | 7/2012 | Sweeney ............ B82Y 20/00 257/103 |

* cited by examiner

LIGHT-EMITTING DEVICE

CROSS REFERENCE TO RELATED APPLICATIONS

This application is a Continuation of co-pending application Ser. No. 14/638,593 filed on Mar. 4, 2015, for which priority is claimed under 35 U.S.C. § 120; and this application claims priority of Application No. 103107811 filed in Taiwan, R.O.C. on Mar. 6, 2014 under 35 U.S.C. § 119; the entire contents of all of which are hereby incorporated by reference.

BACKGROUND OF THE INVENTION

Field of the Invention

The present disclosure relates to a light-emitting device, in particular to an infrared light-emitting device.

Brief Discussion of the Related Art

A light-emitting diode (LED) is suitable for diverse applications because it has good opto-electrical characteristics of low power consumption, low heat generation, long life, shock tolerance, compact, swift response, and stable output wavelength.

More applications are using infrared light-emitting diode nowadays. In addition to the conventional application in remote controllers and monitors, the application of the infrared light-emitting diode in smart phones and touch panels has been developed recently. Compared with other applications, because each touch panel adopts a relatively larger amount of infrared light-emitting diodes, lower price is required. Therefore, reducing the cost of an infrared light-emitting diode is necessary.

FIG. 1 shows a cross-sectional view of a conventional infrared light-emitting diode. As shown in FIG. 1, the light-emitting diode comprises a permanent substrate 101. A light-emitting stack 102, a metal reflective layer 103, a barrier layer 104, and a bonding structure 105 are disposed on the permanent substrate 101 from top to bottom. In addition, a first electrode 106E1 and its extending electrode 106E1' is disposed on the light-emitting stack 102, and a second electrode 106E2 is disposed on the permanent substrate 101. The first electrode 106E1, the extending electrode 106E1', and the second electrode 106E2 are used to provide current to the light-emitting diode. The light-emitting stack 102 emits infrared light. In the manufacturing process of this conventional infrared light-emitting device, the light-emitting stack 102 is originally grown on a growth substrate (not shown), and then the light-emitting stack 102 is bonded to the permanent substrate 101 by the bonding structure 105. Therefore, the metal reflective layer 103 may be formed on the light-emitting stack 102 before the bonding. However, as described above, in some applications, such as the application in touch panels which requires cost reduction, the aforementioned bonding process and the metal reflective layer 103 are the primary causes of high cost. In addition, in order to achieve a larger far field angle of light, more lateral light is required in the application of the touch panels. However, it has been found in reality it is difficult for the above conventional infrared light-emitting device to meet the requirement in this respect.

SUMMARY OF THE INVENTION

The present disclosure provides a light-emitting device. The light-emitting device comprises a substrate; a light-emitting stack on the substrate; and a semiconductor window layer comprising AlGaInP series material disposed between the substrate and the light-emitting stack.

DETAILED DESCRIPTION OF THE PREFERRED EMBODIMENTS

Figure 1:
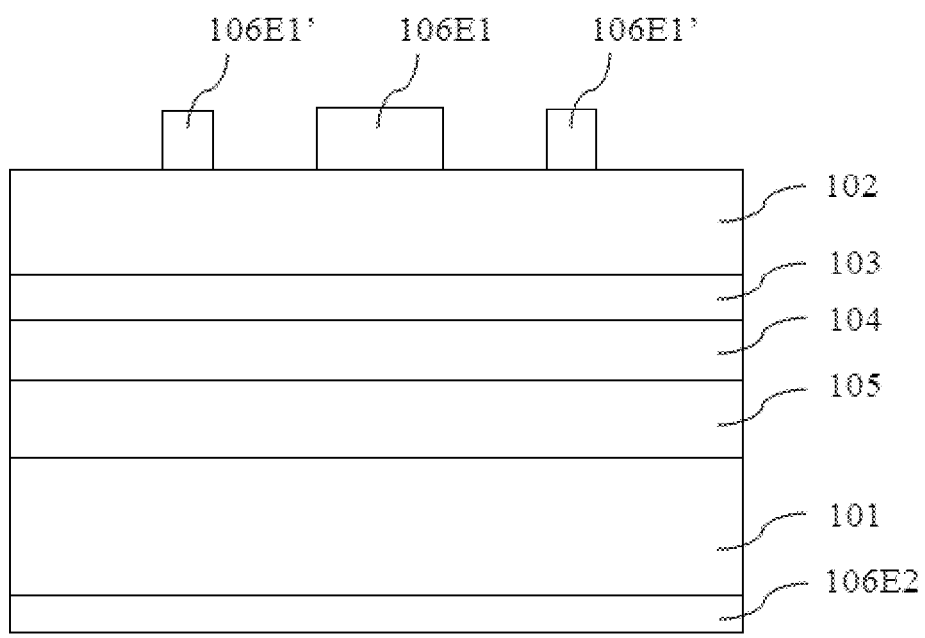
FIG. 1 shows a conventional light-emitting diode.
Figure 2:
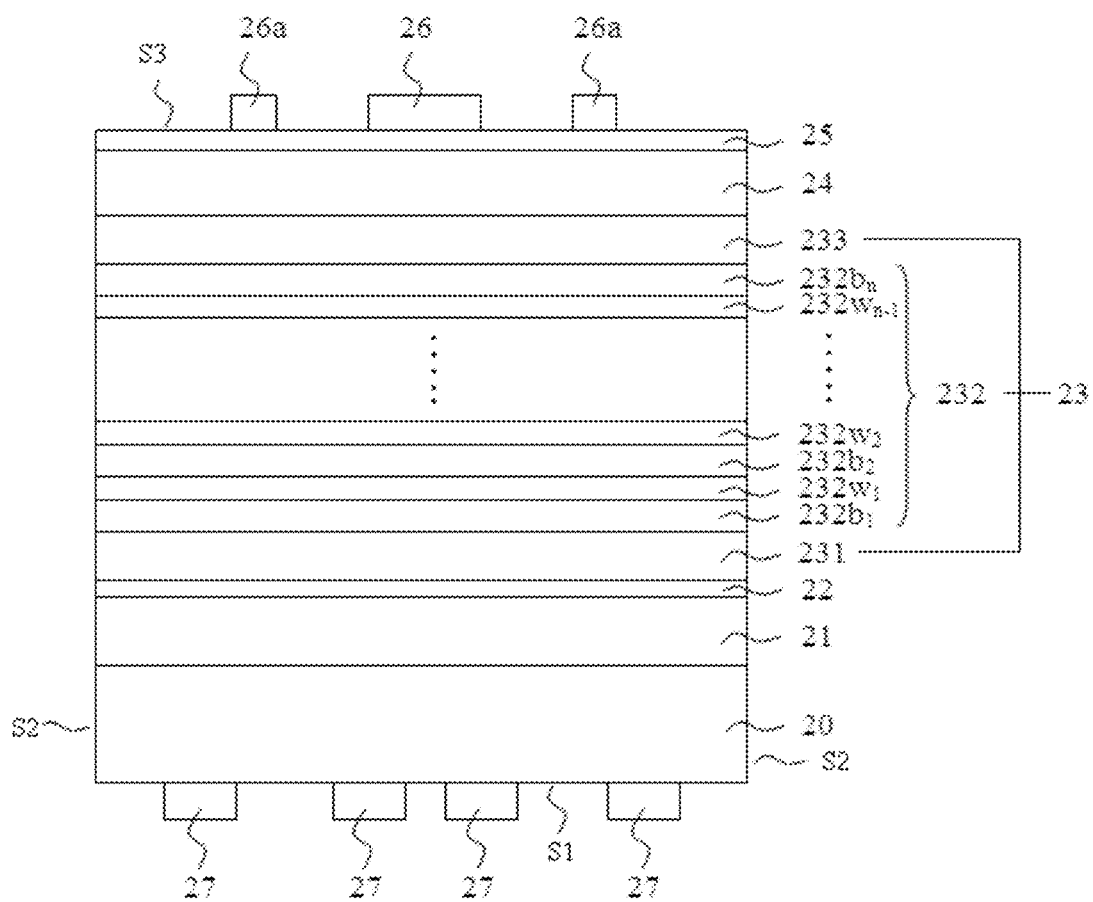
FIG. 2 shows a light-emitting device in accordance with a first embodiment of the present application.

FIG. 2 shows a light-emitting device in accordance with a first embodiment of the present application. As shown in FIG. 2, the light-emitting device comprises: a substrate 20; a light-emitting stack 23 which emits infrared (IR) light on the substrate 20; and a semiconductor window layer 22 comprising AlGaInP series material disposed between the substrate 20 and the light-emitting stack 23, wherein the substrate 20 comprises a gallium arsenide (GaAs) substrate. A wavelength of the infrared light is between about 750 nm and 1100 nm. In one embodiment, the wavelength of the infrared light is larger than 900 nm, for example, 940 nm. The semiconductor window layer 22 is a single layer structure and is in direct contact with the light-emitting stack 23. In a manufacturing process, the light-emitting stack 23 may be formed sequentially after formation of the semiconductor window layer 22 in the same machine which the semiconductor window layer 22 is formed, with the adjustment of kind or ratio of gases supplied to the machine. In one embodiment, the semiconductor window layer 22 comprises $(Al_xGa_{1-x})_{0.5}In_{0.5}P$, wherein x is from 0.1 to 1. It is noted that the light-emitting stack 23 comprises a first refractive index $n_1$, and the semiconductor window layer 22 comprises a second refractive index $n_2$, wherein the first refractive index $n_1$ is greater than the second refractive index $n_2$ by at least 0.2. Therefore, for infrared light emitted by the light-emitting stack 23, when it propagates from the light-emitting stack 23 to the semiconductor window layer 22, it propagates from a high refractive index material to a low refractive index material. In addition, the difference between the first refractive index $n_1$ of the light-emitting stack 23 and the second refractive index $n_2$ of the semiconductor window layer 22 makes the infrared light emitted by the light-emitting stack 23 easier to be totally internally reflected at the semiconductor window layer 22. In other words, the semiconductor window layer 22 functions as a reflective mirror with a single layer structure. In addition, the semiconductor window layer 22 provides better reflection in a lateral direction when compared with a Distributed Bragg Reflector (DBR) structure. A Distributed Bragg Reflector (DBR) structure often needs dozens of layers to achieve a certain degree of reflectivity, and only light having an incident angle limited to a certain range from a normal direction is reflected. For example, light incident in an angle between 0 degree and 17 degrees to a normal of the reflective structure can be reflected. In contrast, light incident in an angle between 50 degrees and 90 degrees to a normal of the semiconductor window layer 22 can be reflected by the single layer structure of the semiconductor window layer 22. The semiconductor window layer 22 provides better light extraction in a lateral direction to form a larger far field angle. Further, an overall output luminous power is raised because light extraction is improved. Practical tests are carried out on the light-emitting devices which emit light with a wavelength of 850 nm and 940 nm, respectively. For the light-emitting device in the embodiment of the present application, aluminum gallium arsenide (AlGaAs) is used for a first conductive type semiconductor layer 231 of the light-emitting stack 23 to have the first refractive index $n_1$ of about 3.4, and $(Al_{0.6}Ga_{0.4})_{0.5}In_{0.5}P$ is used for the semiconductor window layer 22 to have the second refractive index $n_2$ of about 2.98, wherein the difference between these two refractive indices is about 0.42. Compared with a light-emitting device with the same structure except that the semiconductor window layer 22 is changed to aluminum gallium arsenide (AlGaAs) with a refractive index of about 3.4, the output luminous power increases from 4.21 mW to 4.91 mW for the light-emitting device which emits light with a wavelength of 850 nm in the embodiment of the present application. The increase is of about 17%. Similarly, the output luminous power of the light-emitting device to emit light with a wavelength of 940 nm in the embodiment of the present application increases from 5.06 mW to 5.27 mW, by an increase of about 4%. In addition, with regard to the manufacturing process or cost, because the semiconductor window layer 22 is in direct contact with the light-emitting stack 23 and is a single layer structure, the manufacturing process is simplified and the cost is lower when compared with a Distributed Bragg Reflector (DBR) structure. Regarding a thickness of the semiconductor window layer 22, in one embodiment, even a thickness less than 1 μm can have a good reflectivity effect.

The light-emitting stack 23 comprises the first conductive type semiconductor layer 231 on the semiconductor window layer 22, an active layer 232 on the first conductive type semiconductor layer 231, and a second conductive type semiconductor layer 233 on the active layer 232, wherein the first conductive type semiconductor layer 231 is in direct contact with the semiconductor window layer 22. The first conductive type semiconductor layer 231, the active layer 232, and the second conductive type semiconductor layer 232 comprise III-V group material. The first conductive type semiconductor layer 231 and the second conductive type semiconductor layer 233 are of different conductive types. For example, the first conductive type semiconductor layer 231 is an n-type semiconductor layer, and the second conductive type semiconductor layer 233 is a p-type semiconductor layer. When an external power is supplied, the first conductive type semiconductor layer 231 and the second conductive type semiconductor layer 233 generates carriers (electrons/holes) respectively, and the carriers recombine in the active layer 232 to generate light. In one embodiment, the first conductive type semiconductor layer 231 is doped with tellurium (Te) or selenium (Se). The active layer 232 comprises a multiple quantum well (MQW) structure, and the multiple quantum well structure comprises a plurality of barrier layers, such as barrier layers $232b_1, 232b_2, \ldots 232b_n$, and one or more well layers, such as well layers $232w_1, 232w_2, \ldots 232w_{n-1}$. One well layer is disposed between two adjacent barrier layers. For example, the well layer $232w_1$ is disposed between the two adjacent barrier layers $232b_1$ and $232b_2$. For the plurality of barrier layers $232b_1, 232b_2, \ldots 232b_n$, the barrier layer which is closest to the first conductive type semiconductor layer 231 (i.e., the barrier layer $232b_1$) and the barrier layer which is closest to the second conductive type semiconductor layer 233 (i.e., the barrier layer $232b_n$) do not comprise phosphorus (P), while the rest (i.e., barrier layers $232b_2, \ldots 232b_{n-1}$) comprise phosphorus (P). In one embodiment, the well layers $232w_1, 232w_2, \ldots 232w_{n-1}$ comprise indium gallium arsenide (InGaAs), wherein a content of indium is about 2% to 30% and is adjusted according to a wavelength of light to be emitted by the light-emitting stack 23 so that the wavelength of light falls within the aforementioned wavelength range of infrared light. Since indium (In) contained in the well layers $232w_1, 232w_2, \ldots 232w_{n-1}$ makes a lattice constant larger, phosphorus (P) in the barrier layers $232b_2, \ldots 232b_{n-1}$ as mentioned above which makes a lattice constant smaller can be used to adjust an overall lattice constant inversely to an appropriate range. In one embodiment, the barrier layers $232b_2, \ldots 232b_{n-1}$ comprise aluminum gallium arsenic phosphorus (AlGaAsP). Further, as described above, because the barrier layer which is closest to the first conductive type semiconductor layer 231 (i.e., the barrier layer $232b_1$) and the barrier layer which is closest to the second conductive type semiconductor layer 233 (i.e., the barrier layer $232b_n$) do not comprise phosphorus (P), a lattice constant does not become too small even when a thickness is large. When the barrier layer $232b_1$ and the barrier layer $232b_n$ are thicker, they provide a better barrier effect to the diffusion of doped material in the adjacent first conductive type semiconductor layer 231 and the adjacent second conductive type semiconductor layer 233. In one embodiment, the barrier layer $232b_1$ and the barrier layer $232b_n$ comprise aluminum gallium arsenide (AlGaAs).

Figure 3:
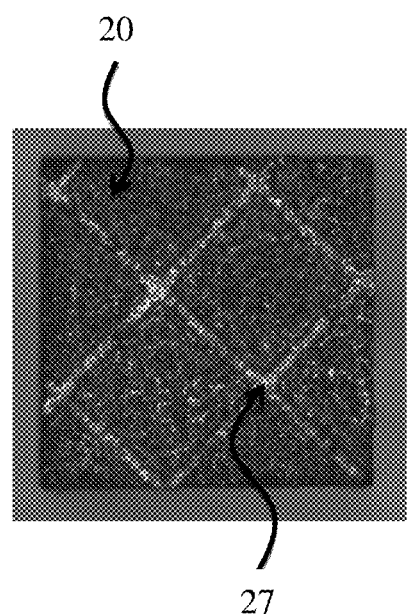
FIG. 3 shows a pattern of a second electrode in the first embodiment of the present application.
Figure 4:
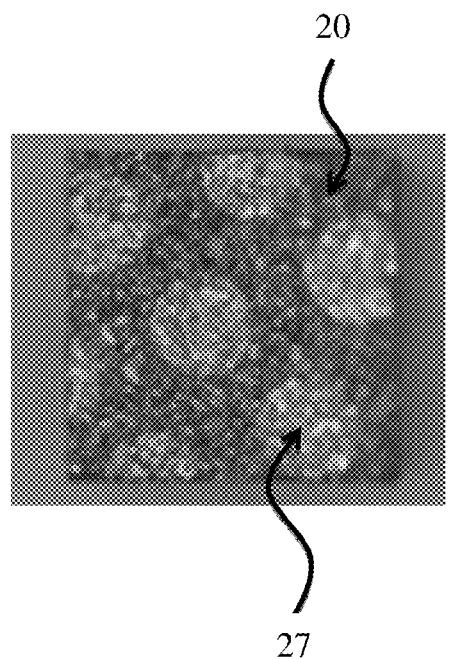
FIG. 4 shows another pattern of the second electrode in the first embodiment of the present application.

The light-emitting device in accordance with the first embodiment of the present application further comprises a buffer layer 21 between the substrate 20 and the semiconductor window layer 22. The buffer layer 21 is doped with silicon (Si). For example, the buffer layer 21 comprises gallium arsenide (GaAs) doped with silicon (Si). As described above, because the first conductive type semiconductor layer 231 is doped with tellurium (Te) or selenium (Se), and the buffer layer 21 is doped with silicon (Si), there is more flexibility in the manufacturing process of the light-emitting device, such as facilitating the adjustment of the lattice constant. In addition, the light-emitting device in accordance with the first embodiment of the present application further comprises a lateral light extraction layer 24 on the light-emitting stack 23, a contact layer 25 on the lateral light extraction layer 24, a first electrode 26 disposed on the contact layer 25, and a second electrode 27 disposed on the substrate 20. The lateral light extraction layer 24 is useful to light extraction, especially to enhanced light extraction from sidewalls because of an increased thickness. Therefore, the thickness of the lateral light extraction layer 24 can be relatively thicker. For example, the thickness of the lateral light extraction layer 24 can be from about 5 μm to 30 μm. In one embodiment, the lateral light extraction layer 24 comprises gallium arsenide (GaAs) doped zinc (Zn), with a thickness of about 10 μm. The contact layer 25 is used to form an ohmic contact with the first electrode 26 to reduce the resistance. In one embodiment, the contact layer 25 comprises gallium arsenide (GaAs) doped with zinc (Zn). The arrangement that both the lateral light extraction layer 24 and the contact layer 25 comprise gallium arsenide (GaAs) doped zinc (Zn) simplifies the arrangement of the machines in the manufacturing process, but it is noted that the lateral light extraction layer 24 and the contact layer 25 are of different functions. To form an ohmic contact, a content of zinc (Zn) in the contact layer 25 is much more than a content of zinc (Zn) in the lateral light extraction layer 24. The first electrode 26 may comprise an extending electrode 26a to facilitate current spreading. It is noted that when infrared light emitted by the light-emitting stack 23 propagates to the substrate 20, it is possible that some light is still not internally reflected at semiconductor window layer 22. In addition, as described previously, a larger far field angle of light is required in some particular applications. Therefore, the second electrode 27 in the present embodiment is a patterned electrode, which is illustrated in detail in FIG. 3 and FIG. 4. From the top view, a pattern of the second electrode 27 may be, for example, a mesh as shown in FIG. 3. A second electrode 27 comprising a mesh of germanium gold (GeAu) on a gallium arsenide (GaAs) substrate is shown in FIG. 3. In another embodiment, a pattern of the second electrode 27 may comprise a plurality of circles as shown in FIG. 4. A second electrode 27 comprising a plurality of circular germanium gold (GeAu) on a gallium arsenide (GaAs) substrate is shown in FIG. 4. The patterned second electrode 27 serves as a scattering center for light which is not totally internally reflected at the semiconductor window layer 22. Therefore, scattering increases and the far field angle of light becomes larger. In addition, as shown in FIG. 2, areas of a bottom surface Si of the substrate 20 on which the second electrode 27 is not disposed can be optionally roughened (not shown) to increase the scattering of light, so that light extraction from the sidewalls of the substrate 20 is enhanced. Further, roughening (not shown) for light extraction can also be performed on the sidewalls S2 of the substrate 20 and areas of a top surface S3 of the light-emitting device on which the first electrode 26 is not disposed.

The above-mentioned embodiments are only examples to illustrate the theory of the present invention and its effect, rather than be used to limit the present application. Other alternatives and modifications may be made by a person of ordinary skill in the art of the present application without departing from the spirit and scope of the application, and are within the scope of the present application.

What is claimed is:

1. A light-emitting device comprising:
    a permanent substrate comprising gallium arsenide and having a first surface and a second surface opposite to the first surface;
    a light-emitting stack on the first surface of the permanent substrate;
    a first electrode disposed on the light-emitting stack and comprising an extending electrode; and
    a second electrode disposed on the second surface of the permanent substrate, and having a pattern comprising a mesh or a plurality of circles from a top view of the light-emitting device.

2. The light-emitting device of claim 1, wherein the light-emitting stack emits infrared light.

3. The light-emitting device of claim 1, further comprising a semiconductor window layer disposed between the permanent substrate and the light-emitting stack.

4. The light-emitting device of claim 3, wherein the semiconductor window layer has a thickness is less than 1 μm.

5. The light-emitting device of claim 1, wherein the second surface of the permanent substrate has a rough area.

6. The light-emitting device of claim 5, wherein the second electrode is not disposed on the rough area of the second surface.

7. The light-emitting device of claim 1, wherein the permanent substrate further comprises sidewalls, and the sidewalls are rough.

8. A light-emitting device comprising:
    a permanent substrate;
    a light-emitting stack emitted infrared light on the permanent substrate, wherein a wavelength of the infrared light is larger than 900 nm;
    a semiconductor window layer comprising AlGaInP series material disposed between the permanent substrate and the light-emitting stack; and
    a patterned electrode on the light-emitting stack, and having a pattern comprising a mesh or circles from a top view of the light-emitting device.

9. The light-emitting device of claim 8, wherein the light-emitting stack comprises:
    a first conductive type semiconductor layer on the semiconductor window layer;
    an active structure on the first conductive type semiconductor layer; and
    a second conductive type semiconductor layer on the active structure.

10. The light-emitting device of claim 9, wherein the first conductive type semiconductor layer is doped with tellurium or selenium.

11. The light-emitting device of claim 9, wherein the active structure comprises barrier layers and well layers, and each of the well layers disposed between two of the barrier layers, and the barrier layer closest to the first conductive type semiconductor layer and the barrier layer closest to the second conductive type semiconductor layer do not comprise phosphorus, while the rest of the barrier layers comprise phosphorus.

12. The light-emitting device of claim 8, wherein the light-emitting device is devoid of Distributed Bragg Reflector (DBR) between the permanent substrate and the light-emitting stack.

13. The light-emitting device of claim 8, wherein the permanent substrate comprises gallium arsenide (GaAs).

14. The light-emitting device of claim 8, wherein the patterned electrode comprises gold.

15. The light-emitting device of claim 8, further comprising a buffer layer between the permanent substrate and the semiconductor window layer.

16. The light-emitting device of claim 8, wherein the semiconductor window layer comprises $(Al_xGa_{1-x})_{0.5}In_{0.5}P$, wherein x is between 0.1 and 1.

17. The light-emitting device of claim 8, further comprising a contact layer on the light-emitting stack, and the contact layer comprising gallium arsenide (GaAs).

18. The light-emitting device of claim 17, wherein the contact layer is doped with zinc (Zn).

19. A light-emitting device comprising:
    a permanent substrate comprising a first surface and a second surface opposite to the first surface;
    a light-emitting stack on the first surface of the permanent substrate and comprising aluminum gallium arsenide;
    a first electrode disposed on the light-emitting stack and comprising an extending electrode; and
    a second electrode disposed on the second surface of the permanent substrate, and having a pattern comprising a mesh or a plurality of circles from a top view of the light-emitting device.

20. The light-emitting device of claim 19, wherein the light-emitting stack emits infrared light.

* * * * *